(12) United States Patent
Iseki et al.

(10) Patent No.: US 6,263,193 B1
(45) Date of Patent: Jul. 17, 2001

(54) MICROWAVE TRANSMITTER/RECEIVER MODULE

(75) Inventors: Yuji Iseki; Keiichi Yamaguchi; Mitsuo Konno, all of Kanagawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/044,911

(22) Filed: Mar. 20, 1998

(30) Foreign Application Priority Data

Mar. 28, 1997 (JP) .................................................. 9-077096

(51) Int. Cl.⁷ ...................................................... H04B 1/38
(52) U.S. Cl. .................. 455/84; 455/84; 455/90; 455/73
(58) Field of Search .................. 455/84, 90, 66, 455/74, 41, 87, 73; 327/564

(56) References Cited

U.S. PATENT DOCUMENTS

| | | | |
|---|---|---|---|
| 5,142,698 | * 8/1992 | Koga et al. | 455/327 |
| 5,335,361 | * 8/1994 | Ghaem | 455/66 |
| 5,404,581 | * 4/1995 | Honjo | 455/90 |
| 5,530,285 | * 6/1996 | Brenndoerfer | 257/691 |
| 5,621,913 | * 4/1997 | Tuttle et al. | 455/90 |
| 5,628,058 | * 5/1997 | Hiraki | 455/90 |
| 5,663,677 | * 9/1997 | Freyman et al. | 327/565 |
| 5,754,948 | * 5/1998 | Metze | 455/66 |
| 5,898,909 | * 4/1999 | Yoshihara et al. | 455/73 |

FOREIGN PATENT DOCUMENTS

| | | |
|---|---|---|
| 43 15847 A1 | 11/1974 | (DE) . |
| 195 25 477 A1 | 1/1996 | (DE) . |
| 0 590 671 A1 | 4/1994 | (EP) . |
| 1-310572 | 12/1989 | (JP) . |
| 2-44902 | 2/1990 | (JP) . |
| 5-67919 | 3/1993 | (JP) . |
| 9-153839 | 6/1997 | (JP) . |

OTHER PUBLICATIONS

A. Inoue, et al., Proc. Of the 1995 Electronics Society Conference of IEICE, pp. C–135, "A 60GHz FM/FSK Transmitter Module", Sep. 5–8, 1995.

K. Ohata, et al., Proc. Of the 1995 Electronics Society Conference of IEICE, pp. C–136, "A 60 GHz Receiver Module", Sep. 5–8, 1995.

Keiichi Ohata, et al., IEEE Transactions on Microwave Theory and Techniques, vol. 44, No. 12, pp. 2354–2360, "Sixty–GHz–Band Ultra–Miniature Monolithic T/R Modules for Multimedia Wireless Communication Systems", Dec. 1996 (pp. 2355, 2357 & 2359 will be submitted later).

* cited by examiner

Primary Examiner—Dwayne D. Bost
Assistant Examiner—Joy Redmon
(74) Attorney, Agent, or Firm—Oblon, Spivak, McClelland, Maier & Neustadt, P.C.

(57) ABSTRACT

A microwave transmitter/receiver module has a package that includes a high-frequency circuit board and an electromagnetically narrowed space. A semiconductor chip is mounted on the circuit board and is contained in the electromagnetically narrowed space. The electromagnetically narrowed space has a cutoff frequency that is higher than a carrier frequency for microwave communication. A receiver antenna pattern is formed on the top surface of the package and is electromagnetically connected to the semiconductor chip through a first slot. A transmitter antenna pattern is formed on the top surface of the package at a different position from the receiver antenna pattern and is electromagnetically connected to the semiconductor chip through a second slot. Since the antenna patterns are on the top surface of the package, the proper performance thereof is secured and the package is compact.

20 Claims, 12 Drawing Sheets

MICROWAVE TRANSMITTER/RECEIVER MODULE

BACKGROUND OF THE INVENTION

1. Field of the Invention

The present invention relates to a microwave transmitter/receiver module that operates in microwave frequency bands involving centimeter waves and millimeter waves.

2. Description of the Related Art

Figure 1A:
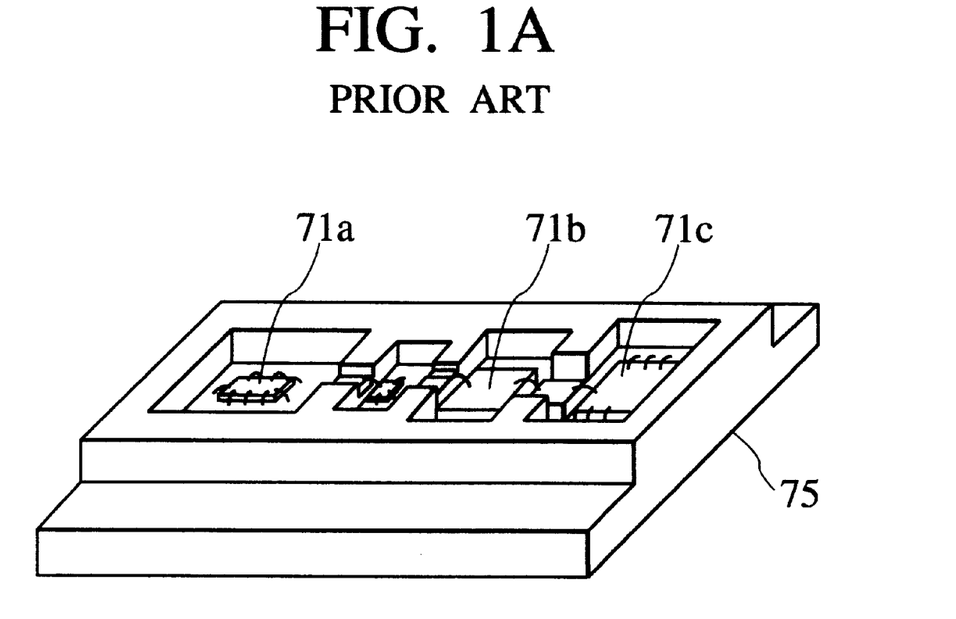
FIG. 1A is a perspective view showing a microwave transmitter module according to a prior art.
Figure 1B:
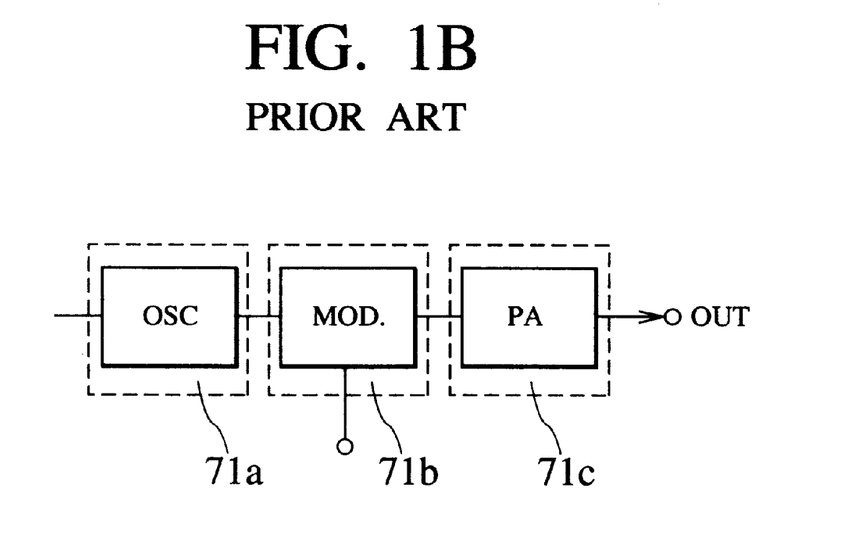
FIG. 1B is a block diagram showing the microwave transmitter module of the prior art.

FIGS. 1A and 1B are a perspective view and a block diagram showing a microwave transmitter module according to a prior art operating in microwave bands around 10 GHz or over including sub-millimeter and millimeter bands.

The module has a semiconductor chip 71a serving as an oscillator (OSC), a semiconductor chip 71b serving as a modulator (MOD), and a semiconductor chip 71c serving as a power amplifier (PA). Each of the chips has a square shape of about 2 mm×2 mm. The chips 71a to 71c are housed in separate chambers and are shielded by a package 75 from external electromagnetic fields. The chips 71a to 71c are connected to one another through microwave transmission lines such as coaxial lines and microstrip lines.

This kind of structure is employed not only for transmitter modules but also for receiver modules having low-noise high-frequency amplifiers (LNAs) and demodulators.

Accommodating the chips 71a to 71c in three separate chambers as shown in FIG. 1A complicates the structure of the package. It is preferable to package all of the chips 71a to 71b in a single chamber and shield them from external electromagnetic fields. The package with a single chamber to accommodate and shield all chips, however, unavoidably has a large space to easily cause a cavity resonance.

Figure 2A:
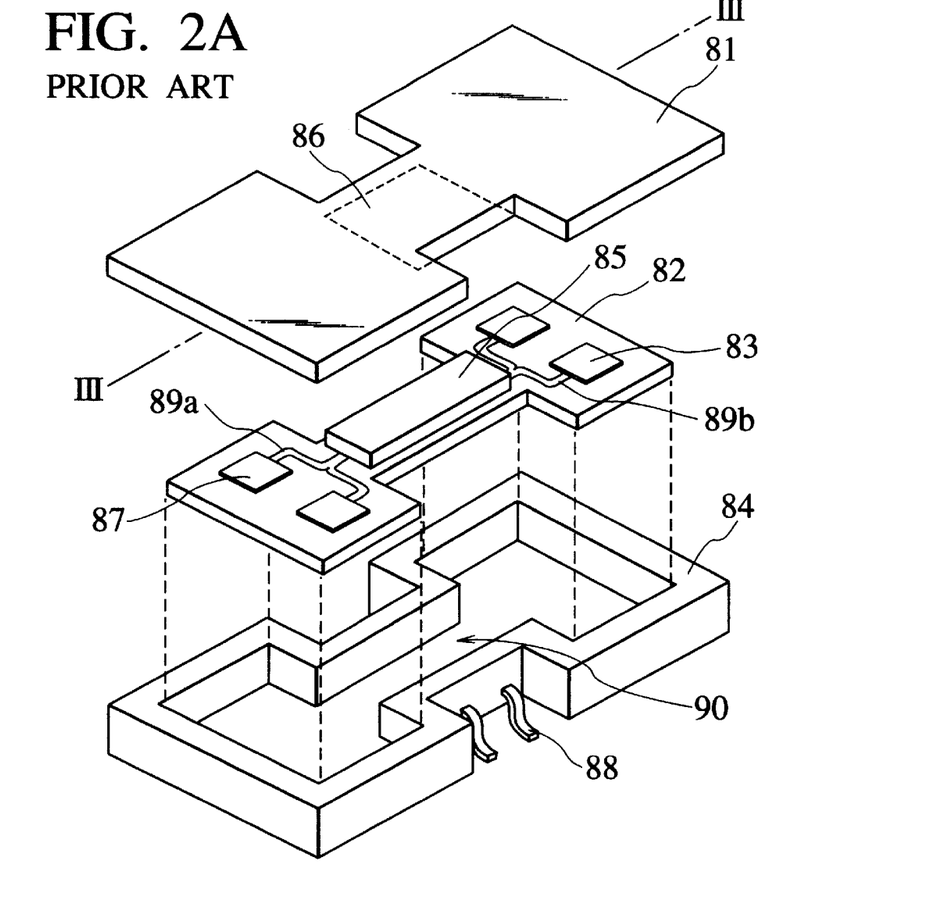
FIG. 2A is an exploded view showing a microwave T/R module having an electromagnetically narrowed space according to a prior art.
Figure 2B:
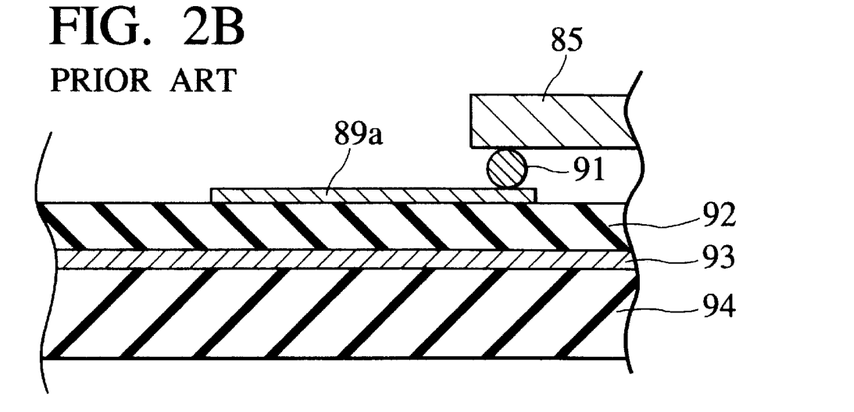
FIG. 2B is a partial sectional view showing a high-frequency circuit board of the module of FIG. 2A.

To solve the problem of cavity resonance, the applicant of the present invention has proposed a microwave transmitter/receiver (T/R) module in Japanese Patent Application No. 8-180846. This module is shown in FIGS. 2A and 2B. The module has a single closed space that contains transmitter and receiver antenna patterns, etc., to provide functions necessary for microwave communication. The closed space has a narrowed space 90.

A semiconductor chip 85 is mounted on a circuit board 82, which is housed in a housing 84 made of a conductor. I/O terminals 88 electrically connecting between the chip 85 and the outside are arranged on side walls at central part of the housing 84 where the narrowed space 90 is present. The housing 84 is covered with a lid 81. A conductor layer 86 is formed at central part of the bottom surface of the lid 81. The narrowed space 90 is an electromagnetically narrowed space defined by three conductor planes consisting of the bottom and two side faces of the narrowed space 90 and one plane consisting of the conductor layer 86 at bottom of the lid 81. The board 82 further has receiver antenna patterns 83, transmitter antenna patterns 87, and feeders 89b and 89a for connecting the antenna patterns 83 and 87 to the chip 85.

FIG. 2B is a sectional view taken along a line III—III of FIG. 2A, showing part of the board 82. The board 82 consists of a first insulation layer or substrate 94, a conductive ground layer 93 formed on the insulation layer 94, and a second insulation layer 92 formed on the ground layer 93. The feeder 89a is formed on the second insulation layer 92 and is connected to the chip 85 through a bump 91.

The electromagnetically narrowed space 90 forms a waveguide. The waveguide has a cutoff frequency that is designed to be higher than a carrier frequency for microwave communication, to avoid the problem of cavity resonance and realize a compact module.

This module has the following problems:

(a) The housing 84 affects the antenna patterns 83 and 87, and therefore, the antenna patterns 83 and 87 must sufficiently be separated from the housing 84. This increases the size of the module and elongates the feeders 89b and 89a between the antenna patterns 83 and 87 and the chip 85, to increase feeder losses.

(b) The lid 81 also affects the antenna patterns 83 and 87. The lid 81 must be thick to provide a sufficient mechanical strength to protect the inside of the module. This, however, increases electromagnetic radiation losses.

In this way, the microwave T/R module of FIGS. 2A and 2B has the problem of large size to secure the performance of the antenna patterns and the problem of electromagnetic radiation losses and feeder losses.

SUMMARY OF THE INVENTION

An object of the present invention is to provide a compact microwave T/R module.

Another object of the present invention is to provide a microwave T/R module capable of suppressing feeder losses and securing high-frequency performance.

Still another object of the present invention is to provide a microwave T/R module capable of suppressing electromagnetic radiation losses and securing the performance of antenna patterns.

Still another object of the present invention is to provide a microwave T/R module that is easy to process and secures high manufacturing yield.

In order to accomplish the objects, a first aspect of the present invention provides a microwave T/R module having at least a package, a receiver antenna pattern, and a transmitter antenna pattern. The package has at least a circuit board and a housing. The circuit board has a semiconductor chip mounted on the bottom surface thereof and serves as a lid to close the housing and contain the semiconductor chip in the housing. The receiver antenna pattern is formed on the top surface of the circuit board. The transmitter antenna pattern is formed on the top surface of the board at a different position from the receiver antenna pattern. When covered with the board, the housing defines an electromagnetically narrowed first space around the semiconductor chip. The first space serves as a waveguide whose cutoff frequency is higher than a carrier frequency for microwave communication. The receiver and transmitter antenna patterns are each electromagnetically connected to the semiconductor chip. More precisely, the antenna patterns and semiconductor chip are connected to each other through electromagnetic energy coupling of electromagnetic waves that pass through slots formed through a conductor layer having a shielding function. This electromagnetic connection or coupling must be discriminated from electrical connection made with flows of electric current. In this specification, the term "microwaves" covers a wide range of microwaves including millimeter waves. Microwave T/R modules of the present invention are applicable to microwaves of, preferably, 10 GHz or above, more preferably, 60 GHz or above. In this specification, the "board" or "circuit board" is a high-frequency circuit board having microstrip lines, etc., and being operable on microwaves of 10 GHz or above.

The microwave T/R module of the first aspect may have second and third spaces. The second space is formed just below the receiver antenna pattern and is so sized to produce a cavity resonance with respect to the carrier frequency for microwave communication. The third space is formed Just below the transmitter antenna pattern and is so sized to produce a cavity resonance with respect to the carrier frequency for microwave communication. The first, second, and third spaces form a single continuous space to simplify the structure of the module.

Consequently, the microwave T/R module of the first aspect is compact and capable of securing the performance of the antenna patterns.

A second aspect of the present invention provides a microwave T/R module having at least a package, a receiver antenna pattern, and a transmitter antenna pattern. The package has at least a housing for accommodating a semiconductor chip. The receiver antenna pattern is formed on the bottom surface of the housing. The transmitter antenna pattern is formed on the bottom surface of the housing at a different position from the receiver antenna pattern. The housing has an electromagnetically narrowed first space to surround the semiconductor chip. The first space serves as a waveguide whose cutoff frequency is higher than a carrier frequency for microwave communication. The receiver antenna pattern is electromagnetically connected to the semiconductor chip through a first slot, and the transmitter antenna pattern is electromagnetically connected to the semiconductor chip through a second slot.

The microwave T/R module of the second aspect may have second and third spaces. The second space is formed just above the receiver antenna pattern and is so sized to produce a cavity resonance with respect to the carrier frequency for microwave communication. The third space is formed just above the transmitter antenna pattern and is so sized to produce a cavity resonance with respect to the carrier frequency for microwave communication. The first, second, and third spaces form a single continuous space to simplify the structure of the module.

Consequently, the microwave T/R module of the second aspect is compact and capable of securing the performance of the antenna patterns.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of microwave devices, it will be appreciated that the various drawings are not drawn to scale from one figure to another nor inside a given figure, and in particular that the layer thicknesses are arbitrarily drawn for facilitating the reading of the drawings.
(FIRST EMBODIMENT)

FIGS. 3A to 3D show a microwave transmitter/receiver (T/R) module according to the first embodiment of the present invention. The module handles millimeter waves in a 60-GHz frequency band.

Figure 3A:
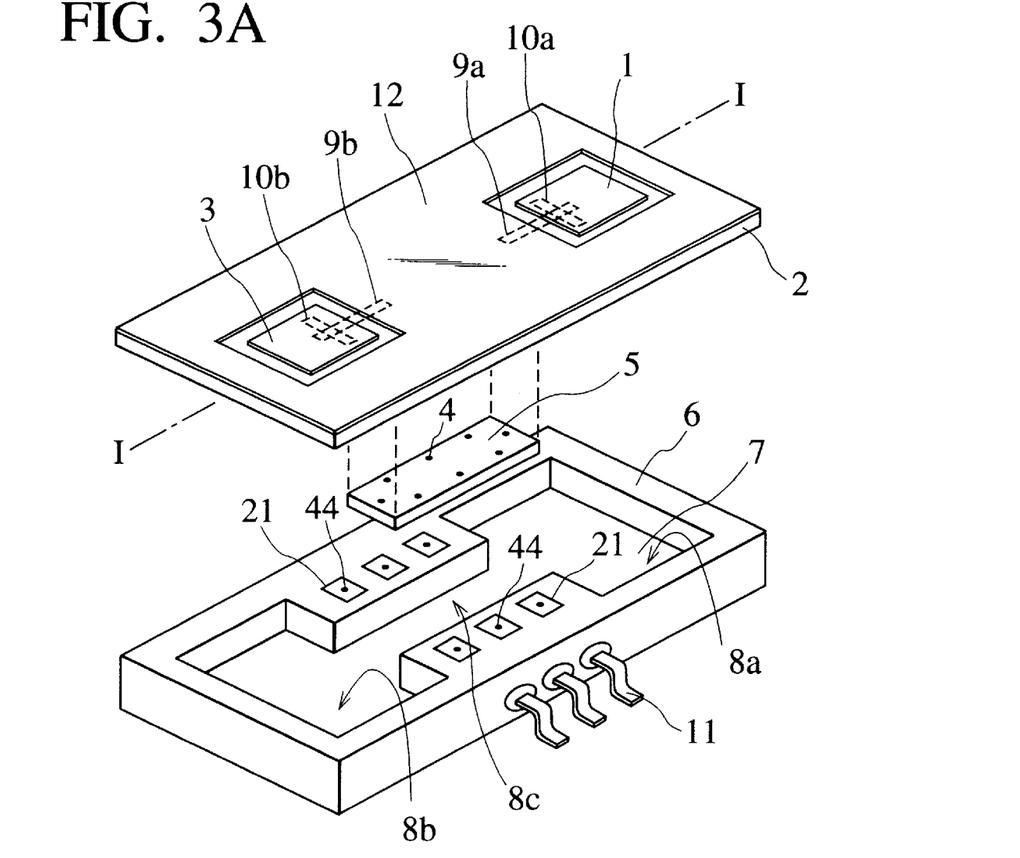
FIG. 3A is an exploded view showing a microwave T/R module according to a first embodiment of the present invention.

The module has a high-frequency circuit board 2 serving as a lid of a housing 6. A receiver antenna pattern 1 and a transmitter antenna pattern 3 are formed on the board 2. The antenna patterns 1 and 3 are surrounded with a ground pattern 12. The housing 6 and board 2 define a closed space 7 having no physical partitions. At central part of the closed space 7, an electromagnetically narrowed first space 8c surrounds a semiconductor chip 5 mounted on the bottom surface of the board 2.

Figure 3B:
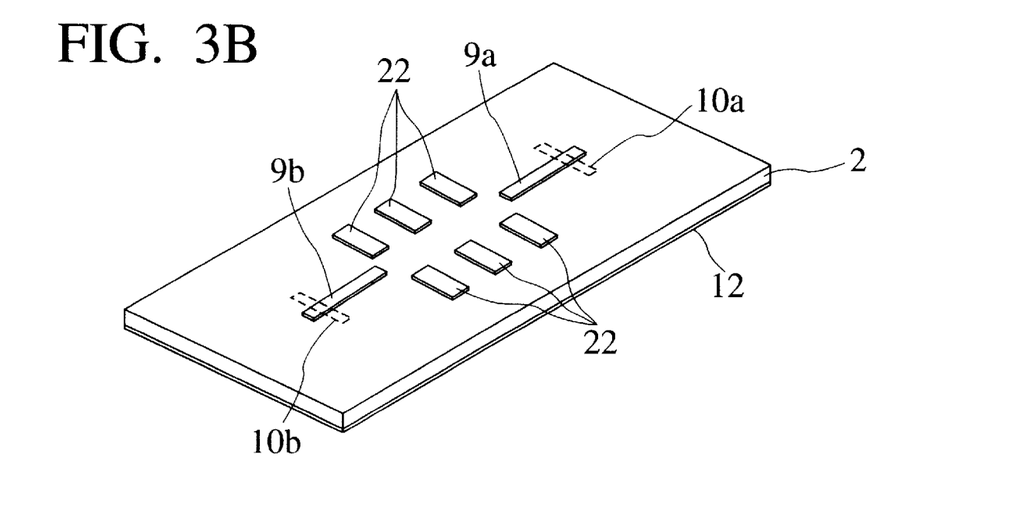
FIG. 3B is a perspective view showing the bottom surface of a high-frequency circuit board serving as a lid of the module of FIG. 3A.

FIG. 3B shows the bottom surface of the board 2. The bottom surface has microwave transmitting copper feeders 9a and 9b, and wiring patterns 22 for passing direct currents or low-frequency signals. The chip 5 has transmitter and receiver functions and is connected to the feeders 9a and 9b and wiring patterns 22 through bump electrodes 4. The chip 5 is fixed to the bottom surface of the board 2 with, for example, an adhesive.

Figure 3C:
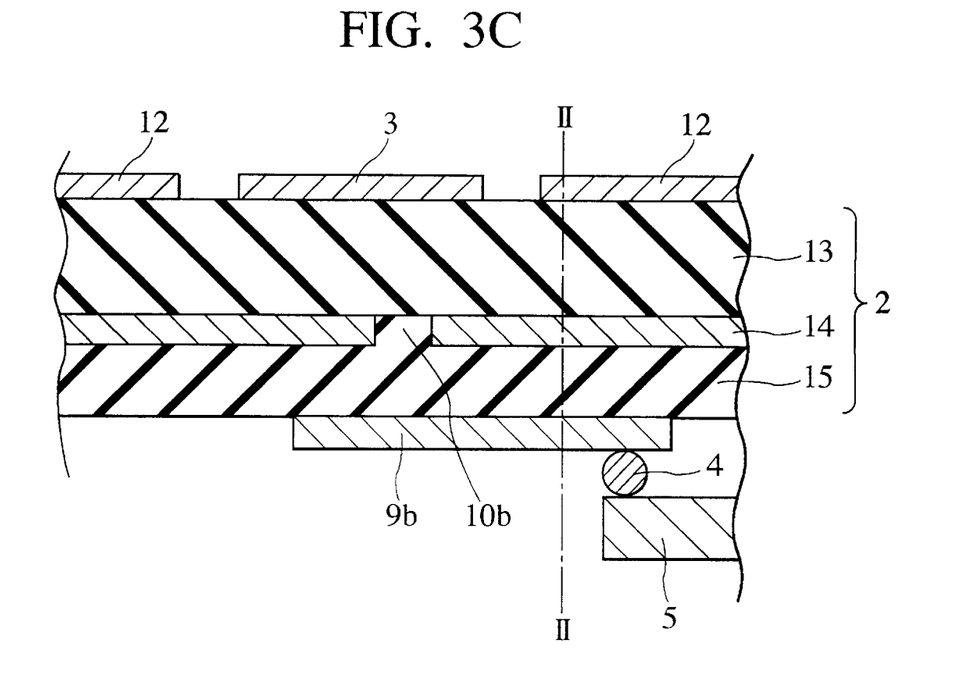
FIG. 3C is a partial enlarged section taken along a line I—I of FIG. 3A, showing the high-frequency circuit board.
Figure 3D:
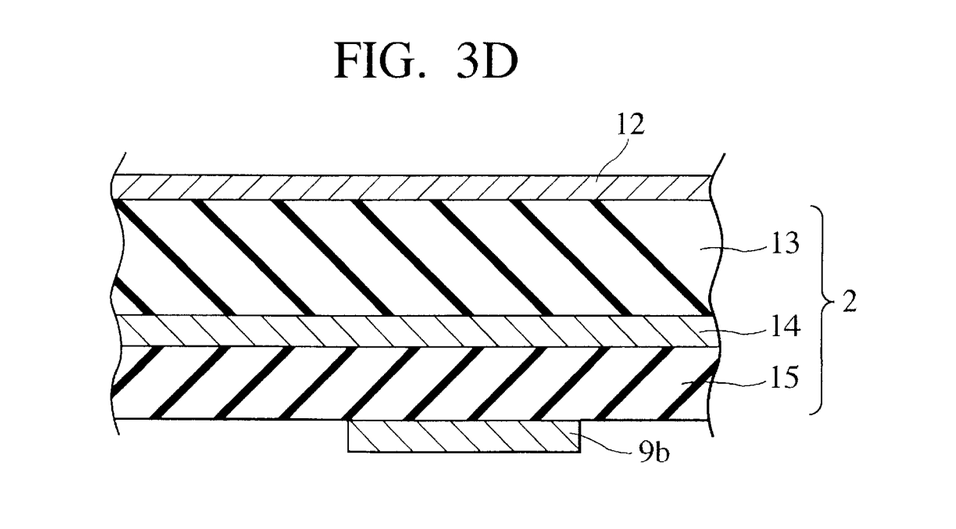
FIG. 3D is a sectional view taken along a line II—II of FIG. 3C.

FIG. 3C is an enlarged partial section taken along a line I—I of FIG. 3A, showing the chip 5 connected to the feeder 9b on the board 2 with the bump electrode 4. FIG. 3D is a sectional view taken along a line II—II of FIG. 3C. The board 2 consists of a first insulation substrate 13, an intermediate conductor layer 14 attached to the bottom surface of the substrate 13, and a second insulation substrate 15 attached to the bottom surface of the layer 14. The first insulation substrate 13 is made of BT (bismaleimide triazine) resin of 500 micrometers thick. On the top surface of the substrate 13, the receiver antenna pattern 1, transmitter antenna pattern 3, and ground pattern 12 are formed from a copper thin film of 17 micrometers thick. The conductor layer 14 is made of a copper thin film of 17 micrometers thick and has a first slot 10a and a second slot 10b. The slots 10a and 10b are each about 0.2 mm×0.6 mm in size and serve to radiate electromagnetic waves. The conductor layer 14 is grounded and connected to the ground pattern 12. The conductor layer 14 is also connected to the housing 6 that is made of conductive material, to provide a shielding function. The second insulation substrate 15 is made of BCB (benzocyclobutene) resin of 10 micrometers thick. On the bottom surface of the substrate 15, there are formed 3-micrometer-thick copper wires serving as the first feeder 9a for the antenna pattern 1 and the second feeder 9b for the antenna pattern 3. The BT resin of the first insulation substrate 13 has a dielectric constant of 4.5, and the BCB resin of the second insulation substrate 15 has a dielectric constant of 2.7.

The conductor layer 14 covers the board 2 entirely except the slots 19a and 19b. As a result, four side planes of the narrowed space 8c are surrounded with conductors, to form a waveguide. The narrowed space 8c is so sized to make the cutoff frequency of the waveguide higher than the highest of carrier frequencies that are used for microwave communication and are received and transmitted through the antenna patterns 1 and 3. The waveguide made of the narrowed space 8c is not intended to guide microwave signals for the module but is intended to block electromagnetic waves for microwave communication from entering the chip 5 and the periphery thereof.

I/O terminals 11 pass baseband signals, power, and control signals for the chip 5. The I/O terminals 11 are not used to pass 60-GHz high-frequency signals for microwave communication. Instead, they pass low-frequency signals lower than the carrier frequencies for microwave communication. The I/O terminals 11 are connected to wiring patterns 21 formed on the top surface of the housing 6 through conductors (not shown) embedded in the housing 6. The module of FIG. 3A has six I/O terminals 11 including three that are hidden behind the housing 6. The six I/O terminals 11 correspond to the wiring patterns 21, respectively. The I/O terminals 11 are individually assigned to pass a baseband signal to the chip 5, a baseband signal from the chip 5, power to drive the chip 5, and control signals to control the chip 5, according to the specifications of the chip 5. The wiring patterns 21 on the top surface of the housing 6 and the wiring patterns 22 on the bottom surface of the board 2 are connected to each other through bump electrodes 44.

Each of the feeders 9a and 9b has a characteristic impedance of 50 ohms and a width of 25 micrometers. To control the characteristic impedance of the feeders 9a and 9b, known microstrip line designing theories are used. The feeder 9b radiates electromagnetic millimeter waves through the slot 10b formed through the conductor layer 14, to excite the transmitter antenna pattern 3. The receiver antenna pattern 1 radiates electromagnetic millimeter waves through the slot 10a formed through the conductor layer 14, to excite the feeder 9a.

Figure 4:
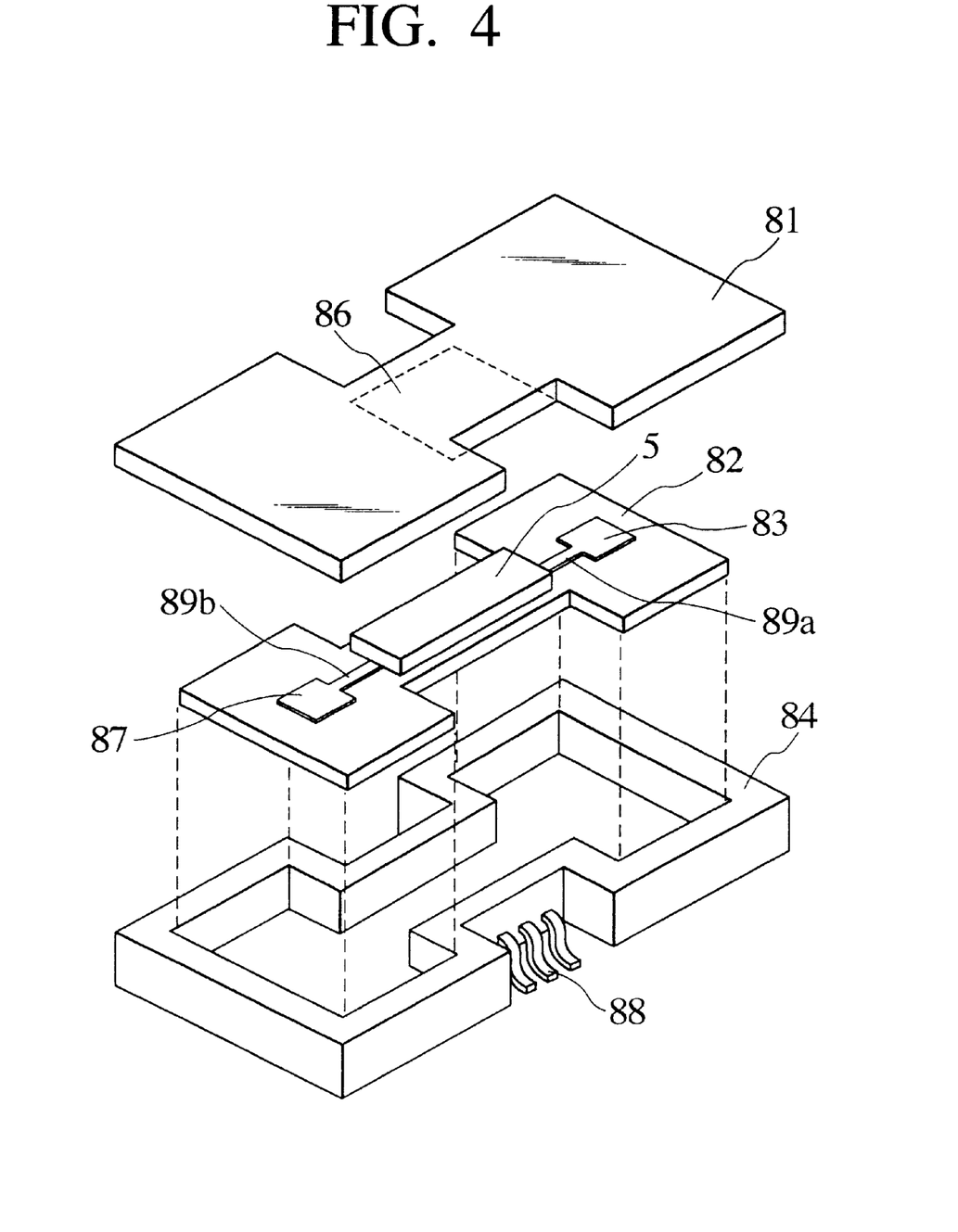
FIG. 4 is an exploded view showing a comparison microwave T/R module to evaluate the performance of the microwave T/R module of the first embodiment.

FIG. 4 shows a comparison microwave T/R module to examine the performance of the microwave T/R module of the first embodiment. The comparison module resembles the module of FIG. 2A except that the comparison module has only one receiver antenna pattern 83 and one transmitter antenna pattern 87 so that they correspond to those of the first embodiment. To avoid the influence of the walls of a housing 84, the comparison module arranges the antenna patterns 83 and 87 away from the walls by about 10 mm. The antenna patterns 83 and 87 have each about 1.5 mm×1.5 mm in size, and therefore, feeders 89a and 89b extend each for 10 mm to cause a loss of about 1.5 dB. The comparison module has 20 mm×50 mm in external size.

On the other hand, the first embodiment arranges the antenna patterns 1 and 3 on the outer surface of the module, i.e., on the top surface of the board 2 so that the walls of the housing 6 make no influences and so that the antenna patterns 1 and 3 are not restricted in their locations. The feeders 9a and 9b of the first embodiment extend each for about 1.5 mm to suppress a feeder loss to one sixth of the prior art. The module of the first embodiment is compact and measures only about 10 mm×25 mm in external dimensions.

The housing 6 of the first embodiment has a second space 8a Just below the antenna pattern 1 and a third space 8b just below the antenna pattern 3. The second and third spaces 8a and 8b are so sized to produce a cavity resonance on a carrier frequency for microwave communication. This improves the efficiency of the antenna patterns 1 and 3. The first narrowed space 8c and the second and third spaces 8a and 8b form a single continuous H-shaped space to simplify the structure of the housing 6.

Figure 5A:
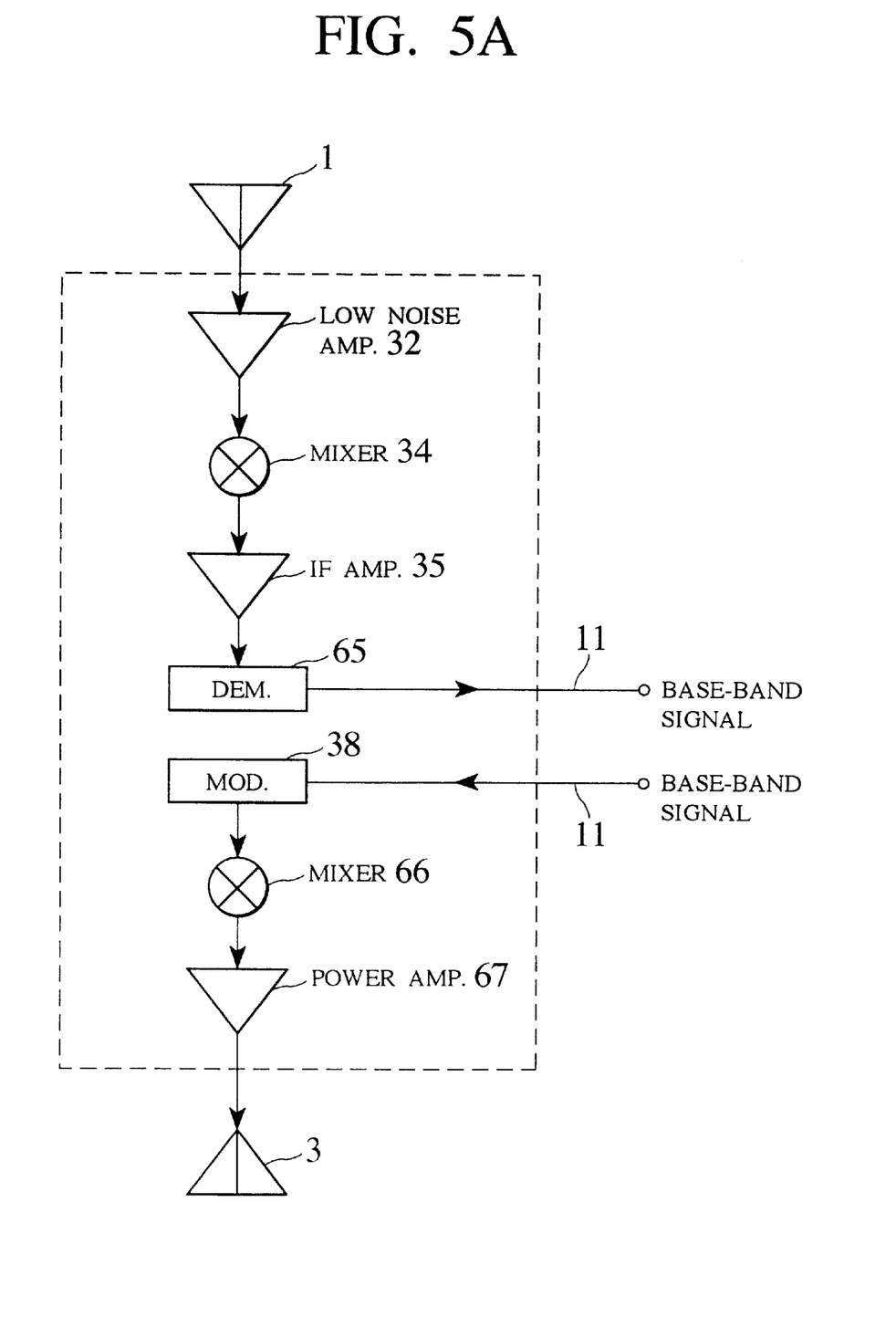
FIGS. 5A and 5B are block diagrams showing examples of semiconductor chips to be installed in the microwave T/R module of the first embodiment.

FIG. 5A is a block diagram showing an example of the chip 5 installed in the module of the first embodiment. The chip 5 has a low-noise amplifier 32 connected to the receiver antenna pattern 1 through the first feeder 9a and first slot 10a. The low-noise amplifier 32 is connected to a mixer 34, which is connected to an intermediate frequency (IF) amplifier 35, which is connected to a demodulator 65. The demodulator 65 provides a baseband signal through the I/O terminal 11. The mixer 34 receives a signal from an oscillator (not shown) and a signal from the low-noise amplifier 32. The chip 5 further has a modulator 38 to receive a baseband signal from the I/O terminal 11. The modulator 38 is connected to a mixer 66, which is connected to a power amplifier 67. The mixer 66 receives a signal from the oscillator (not shown) and a signal from the modulator 38. The power amplifier 67 is connected to the transmitter antenna pattern 3 through the second feeder 9b and second slot 10b.

Figure 5B:
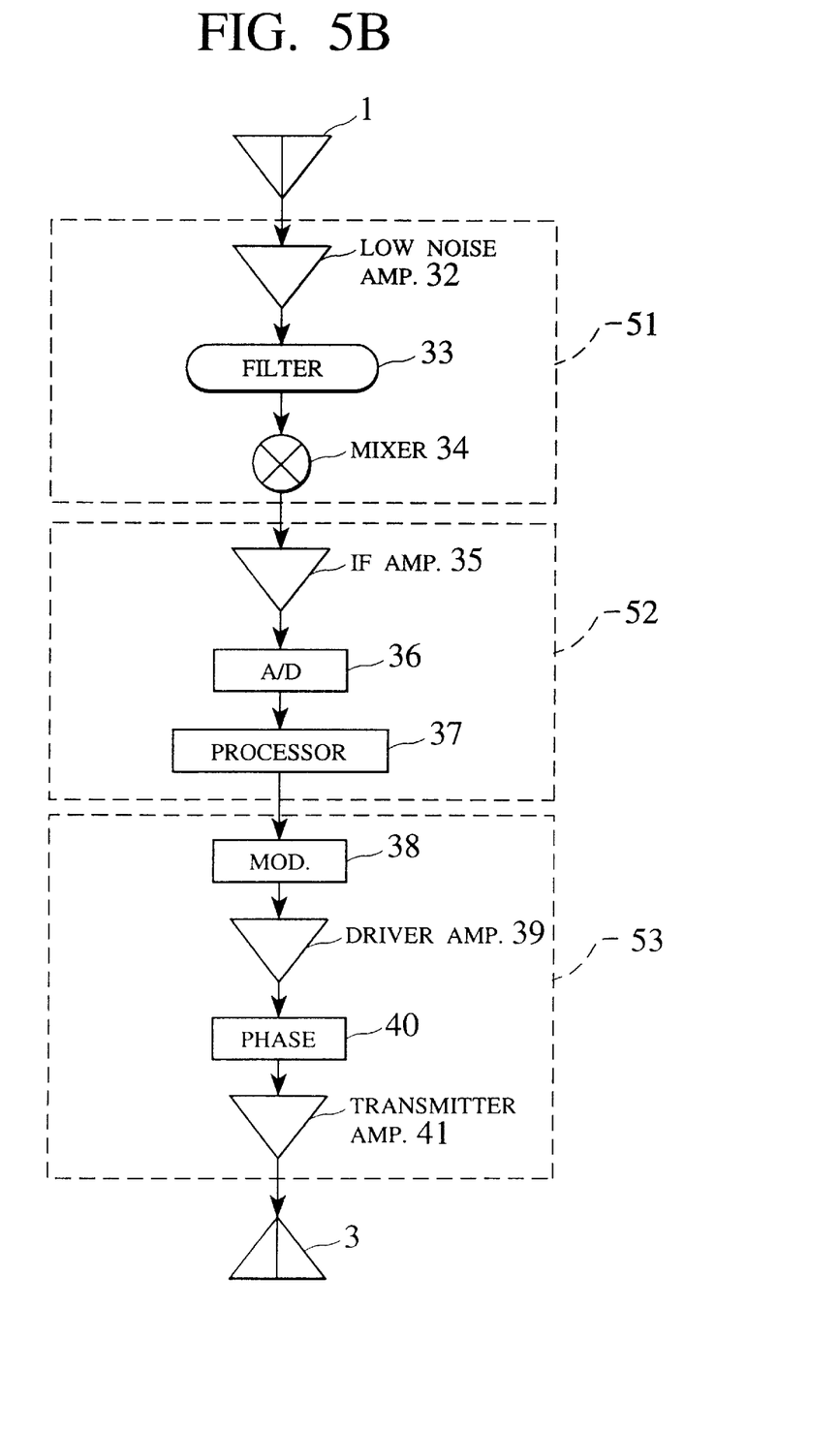

FIG. 5B shows another example of the chip 5 installed in the module of the first embodiment. The chip 5 has a low noise amplifier 32 connected to the receiver antenna pattern 1 through the first feeder 9a and first slot 10a. The low-noise amplifier 32 is connected to a filter 33, which is connected to a mixer 34. The mixer 34 is connected to an intermediate frequency (IF) amplifier 35, which is connected to an A/D converter 36. The A/D converter 36 is connected to a processor 37, which is connected to a modulator 38. The modulator 38 is connected to a driver amplifier 39, which is connected to a phase unit 40, which is connected to a transmitter amplifier 41. The transmitter amplifier 41 is connected to the transmitter antenna pattern 3 through the second feeder 9b and second slot 10b.

The package Including the housing 6 of the first embodiment is made of a conductor and is insulated from the semiconductor chip 5 and receiver and transmitter antenna patterns 1 and 3. The housing 6 and semiconductor chip 5 may be insulated from each other by filling the space between them with dry air or inert gas or by molding the semiconductor chip 5 with insulating grease or resin of high thermal conductivity.

Figure 6:
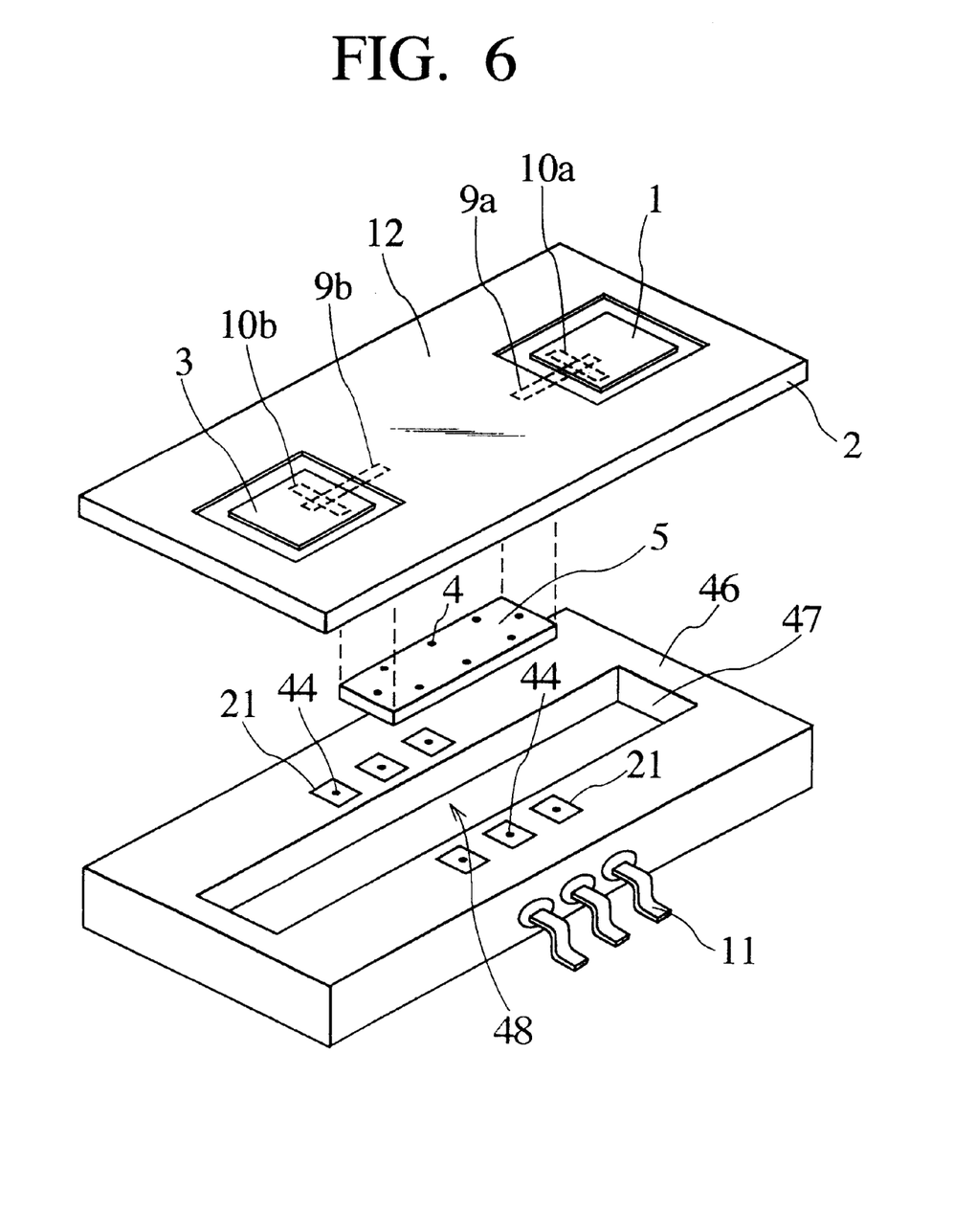
FIG. 6 is an exploded view showing a microwave T/R module according to a modification of the first embodiment.

FIG. 6 is an exploded view showing a microwave T/R module according to a modification of the first embodiment. A high-frequency circuit board 2 serves as a lid of a housing 46 of the module. A receiver antenna pattern 1 and a transmitter antenna pattern 3 are formed on the board 2. A ground pattern 12 is formed around the antenna patterns 1 and 3. Slots 10a and 10b for radiating electromagnetic waves are formed in the board 2. The module contains a groove 48 having a uniform width. The groove 48 is an integration of an electromagnetically narrowed first space, a second space just below the receiver antenna pattern 1, and a third space just below the transmitter antenna pattern 3. A semiconductor chip 5 is placed at central part in the groove 48. The board 2 consists of a first insulation substrate, an intermediate conductor layer attached to the bottom surface of the first insulation substrate, and a second insulation substrate attached to the bottom surface of the intermediate conductor layer. The first and second slots 10a and 10b are formed at predetermined positions on the intermediate conductor layer. First and second feeders 9a and 9b are formed on the bottom surface of the second insulation substrate. Four side planes of the first space at the central part of the groove 48 is surrounded with conductors, to form a waveguide. The groove 48 is so sized to make the cutoff frequency of the waveguide higher than the highest of carrier frequencies for microwave communication. I/O terminals 11 pass baseband signals, power, and control signals. The I/O terminals 11 are connected to wiring patterns 21 formed on the top surface of the housing 46 through conductors (not shown) embedded in the housing 46.

The second and third spaces under the antenna patterns 1 and 3 and the electromagnetically narrowed first space are closed with the board 2, to provide a continuous closed space 47. Integrating the first to third spaces into the groove 48 having a uniform width improves the processibility of the module.

Figure 7:
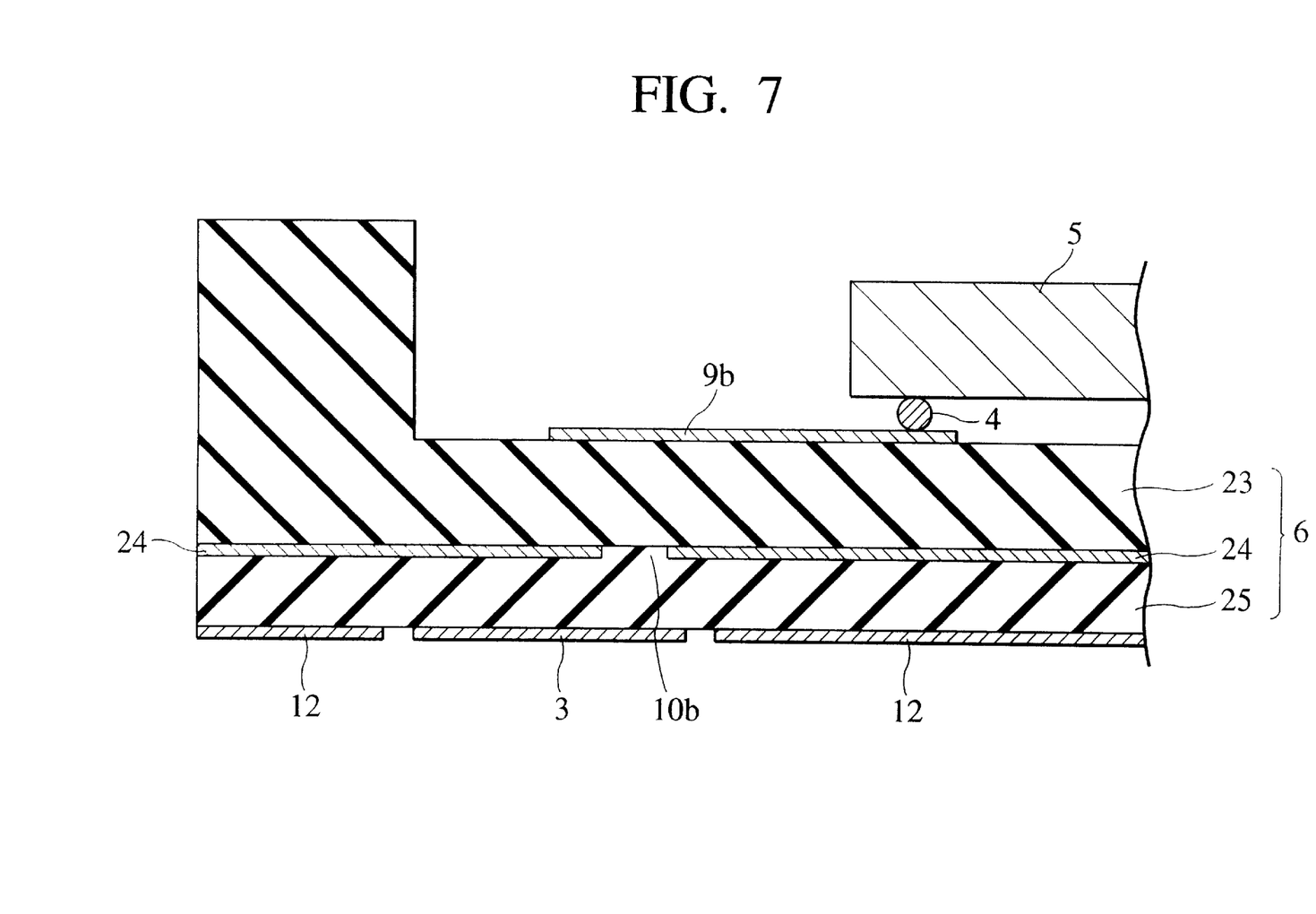
FIG. 7 is a partial sectional view showing a microwave T/R module according to another modification of the first embodiment.

FIG. 7 is a partial sectional view showing a microwave T/R module according to another modification of the first embodiment. The figure particularly shows part of a housing around a transmitter antenna pattern 3. Unlike the structure of FIGS. 3A to 3D that employs the board 2 as a lid of the housing 6, the modification of FIG. 7 mounts a semiconductor chip 5 in the housing and employs a high-frequency circuit board as a lid of the housing. In this case, the transmitter antenna pattern 3, etc., are formed on the bottom surface of the housing. The housing consists of an insulation substrate 25 on which the transmitter antenna pattern 3 is formed, an intermediate conductor layer 24 attached to the top surface of the substrate 25 and having a second slot 10b, and an insulation substrate 23 attached to the top surface of the conductor layer 24. The insulation substrate 25 may be made of BCB or BT resin. The transmitter antenna pattern 3 and a ground pattern 12 formed on the bottom surface of the insulation substrate 25 are made of a copper thin film of 17 micrometers thick. The top surface of the insulation substrate 25 is substantially entirely covered with the intermediate conductor layer 24 made of a copper film of 17 micrometers thick. The second slot 10b is formed at a predetermined position on the conductor layer 24. The conductor layer 24 is grounded and connected to the ground pattern 12.

A second feeder 9b is formed on the top surface of the insulation substrate 23 from a copper wire of 3 micrometers thick. The second feeder 9b is connected to the chip 5 through a bump electrode 4. The insulation substrate 23 may be made of ceramics such as alumina and aluminum nitride, or BCB or BT resin.

Although FIG. 7 shows only the transmitter antenna pattern 3 side, the module has a receiver antenna pattern side having a first slot, a first feeder, etc., to form a like structure. Namely, the modification of FIG. 7 replaces the board 2 side of the structure of FIGS. 3A to 3D with the housing 6 side thereof.

(SECOND EMBODIMENT)

Figure 8:
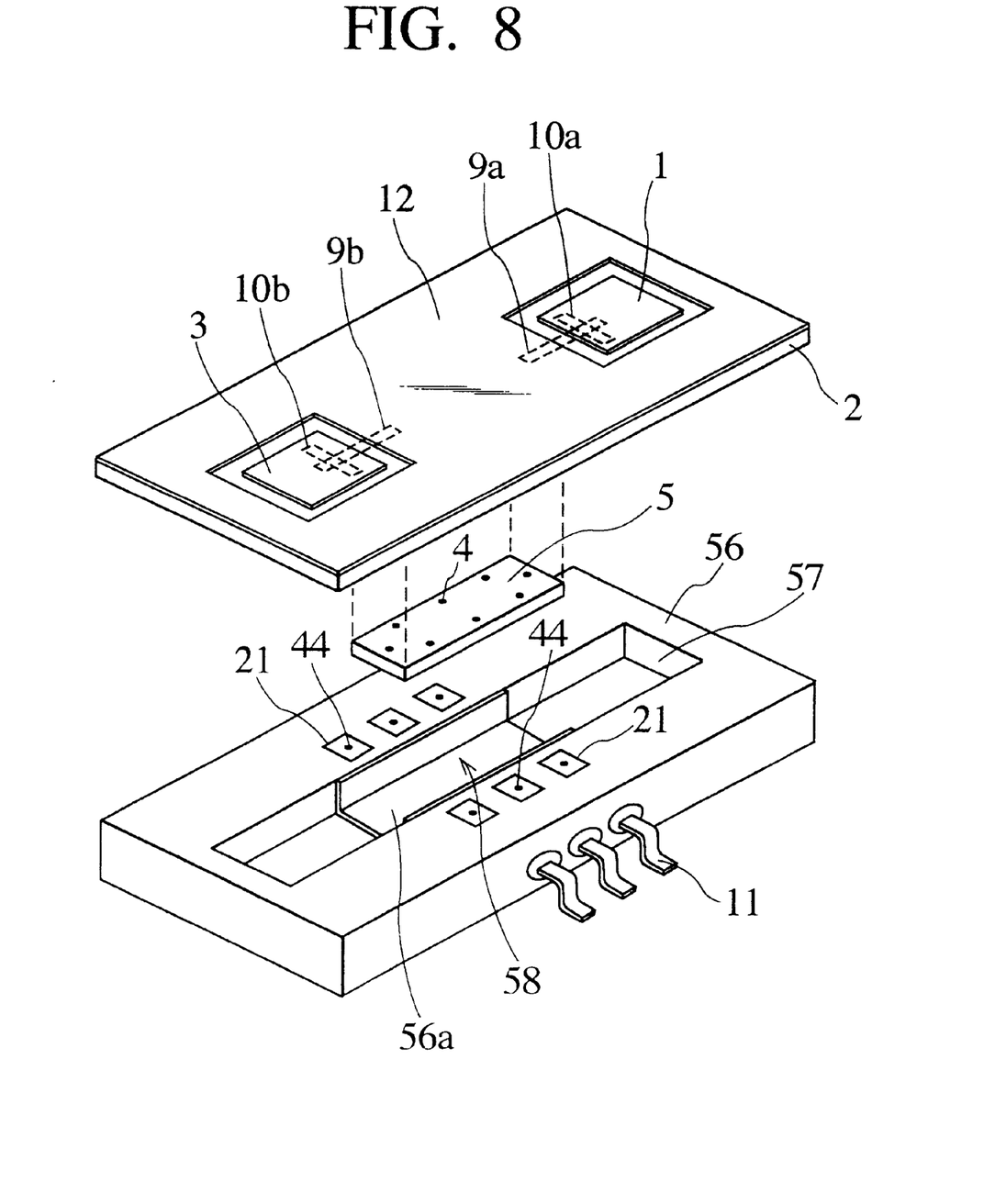
FIG. 8 is an exploded view showing a microwave T/R module according to a second embodiment of the present invention.

FIG. 8 is an exploded view showing a microwave T/R module according to a second embodiment of the present invention. A high-frequency circuit board 2 serves as a lid of a housing 56. A receiver antenna pattern 1 and a transmitter antenna pattern 3 are formed on the board 2. A ground pattern 12 is formed around the antenna patterns 1 and 3. Slots 10a and 10b for radiating electromagnetic waves are formed in the board 2. The housing 56 made of insulator such as ceramics has a groove 58 having a uniform width. A semiconductor chip 5 is placed in a central first space in the groove 58. Walls of the first space are processed by, for example, electrolytic plating or non-electrolytic plating to form a conductor 56a that makes the first space into an electromagnetically narrowed space. There are second and third spaces on each side of the first space in the groove 58. The first space serves as a waveguide. The groove 58 is so sized to make the cutoff frequency of the waveguide higher than the highest of carrier frequencies for microwave communication.

Similar to the first embodiment, the board 2 consists of a first insulation substrate, an intermediate conductor layer attached to the bottom surface of the first insulation substrate, and a second insulation substrate attached to the bottom surface of the intermediate conductor layer. The first and second slots 10a and 10b are formed at predetermined positions on the intermediate conductor layer. On the bottom surface of the second insulation substrate, first and second feeders 9a and 9b are formed. I/O terminals 11 pass baseband signals, power, and control signals for the chip 5. The I/O terminals 11 are connected to wiring patterns 21 formed on the housing 56, through conductors (not shown) embedded in the housing 56. The wiring patterns 21 and wiring patterns formed on the bottom surface of the board 2 are connected to each other through bump electrodes 44. The wiring patterns on the bottom surface of the board 2 are also connected to pad patterns of the chip 5 through bump electrodes 4, so that DC bias and low-frequency signals are passed to and from the chip 5 through the I/O terminals 11. The second and third spaces under the antenna patterns 1 and 3 and the electromagnetically narrowed first space form a closed space 57.

Forming the electromagnetically narrowed first space at the center of the groove 58 of uniform width improves the processibility of the module. The second embodiment, therefore,.provides the same effect as the first embodiment without complicating the structure thereof.

Like the first embodiment, the second and third spaces of the second embodiment may be widened broader than the first space, to provide an H-shaped space. In this case, the second and third spaces are sized to produce a cavity resonance on a carrier frequency used for microwave communication. This results in improving the efficacy of the antenna patterns 1 and 3.

(OTHER EMBODIMENTS)

Figure 9:
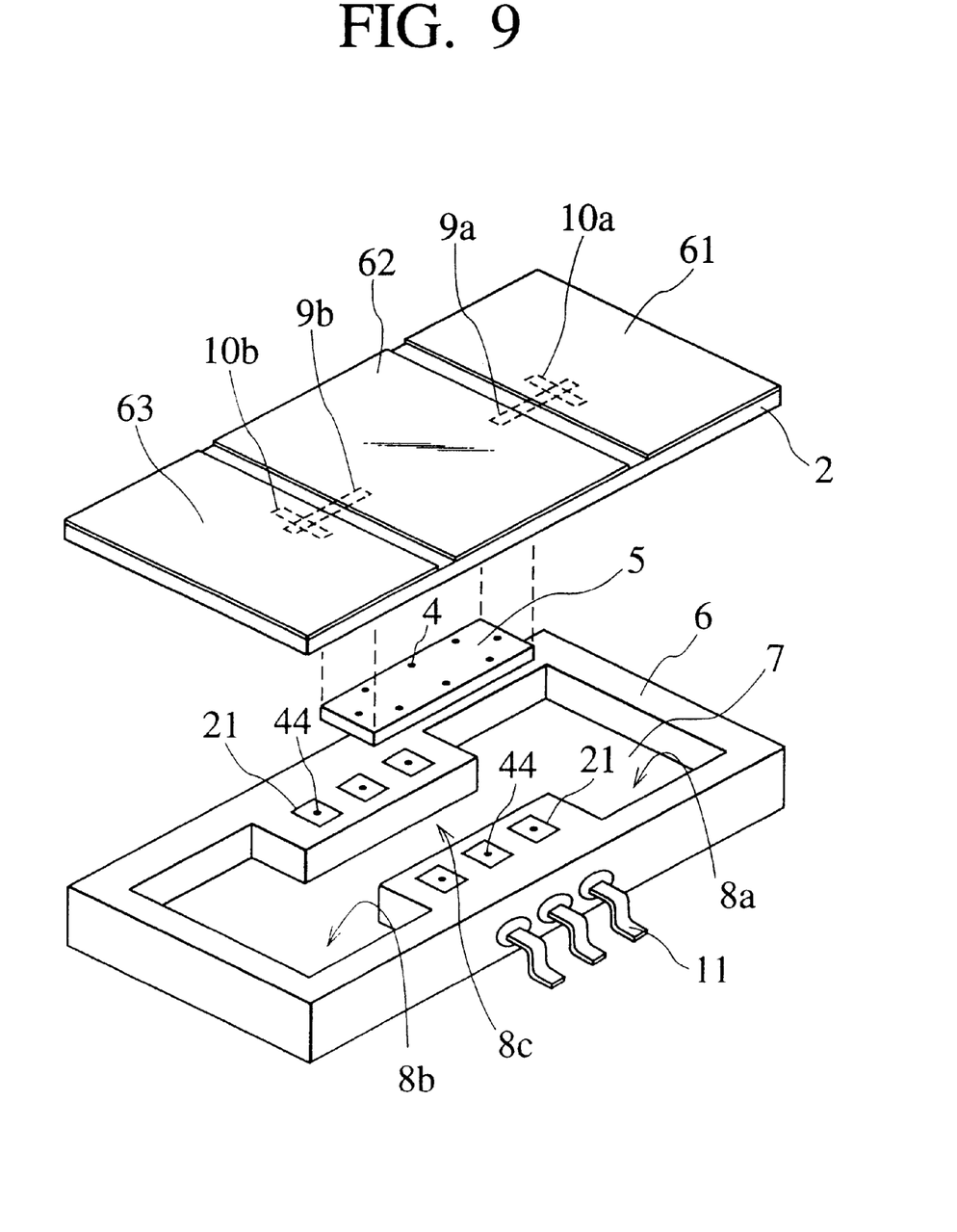
FIG. 9 is an exploded view showing a microwave T/R module according to another embodiment of the present invention.

The present invention is not limited to the first and second embodiments. According to the first and second embodiments, the receiver and transmitter antenna patterns 1 and 3 are formed like islands on the top surface of the board 2 that serves as a lid of the package, and the ground conductor layer 12 is formed on the top surface of the board 2 surrounding the antenna patterns 1 and 3. Instead, an embodiment of the present invention of FIG. 9 forms a ground conductor layer 62 between a receiver antenna pattern 61 and a transmitter antenna pattern 63 on the top surface of a circuit board 2. The antenna patterns 61 and 63 have the same width as the board 2. This arrangement effectively expands the areas of the antenna patterns 61 and 63 without an interference between them. The housing of FIG. 9 has a first space having a cutoff frequency higher than a carrier frequency for microwave communication, a second space 8a just below the receiver antenna pattern 61 and a third space 8b just below the transmitter antenna pattern 63. The second and third spaces 8a and 8b are so sized to produce a cavity resonance on a carrier frequency for microwave communication.

Figure 10:
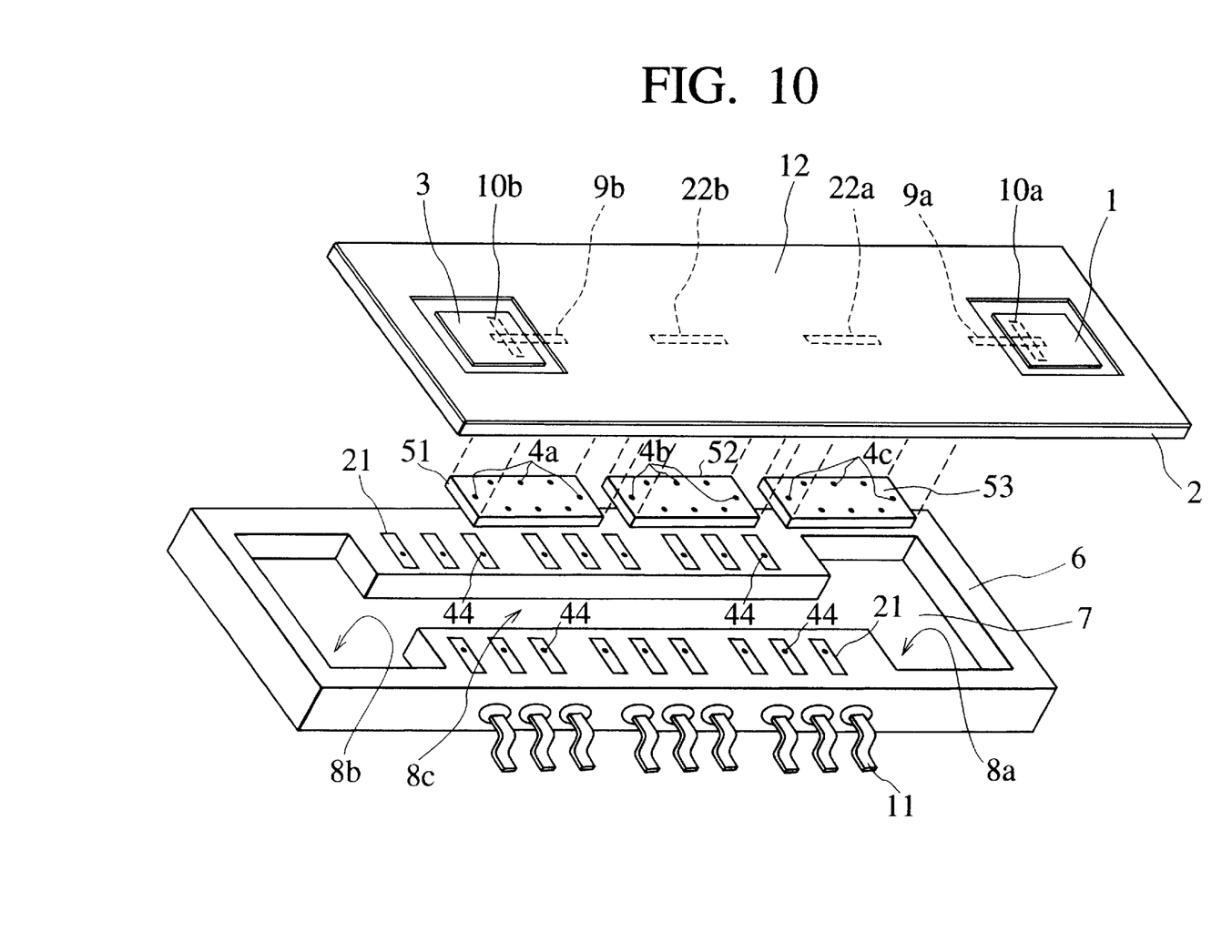
FIG. 10 is an exploded view showing a microwave T/R module according to still another embodiment of the present invention.

FIG. 10 shows still another embodiment of the present invention that arranges two or more semiconductor chips in an electromagnetically narrowed space of a microwave T/R module. In FIG. 10, the electromagnetically narrowed space 8c accommodates three semiconductor chips 51, 52, and 53. These chips may correspond to the circuit blocks 51 to 53 of FIG. 5B. On the semiconductor chip 51, eight bump electrodes 4a are formed. One of bump electrodes 4a is connected to feeder 9b, and another is connected to wiring pattern 22b formed on the bottom surface of the board 2. The other bump electrodes 4a are connected to wiring patterns formed on the bottom surface of the board 2 (not shown in FIG. 10), which are connected to wiring patterns 21 formed on housing 6 through bump electrode 44, respectively. On the semiconductor chips 52, 53, bump electrodes 4b, 4c are formed respectively. One of bump electrodes is connected to wiring pattern 22b, thereby connecting two semiconductor chips 51, 52 mutually. Another bump electrode 4b and one of bump electrodes 4c are connected to wiring pattern 22a formed on the bottom surface of the board 2, so as to connect two semiconductor chips 52, 53 mutually. Another bump electrode 4c is connected to feeder 9a formed on the bottom surface of the board 2. The feeders 9a and 9b are electromagnetically coupled to the antenna patterns 1 and 3 through slots 10a, 10b, respectively. Other bump electrodes 4b, 4c are connected to wiring patterns formed on the bottom surface of the board 2 (not shown in FIG. 10), which are connected to wiring patterns 21 through bump electrodes 44, respectively.

The circuit blocks 51 and 53 may be compound semiconductor chips made of, for example, gallium arsenide (GaAs), and the circuit block 52 may be a silicon (Si) LSI chip. When the circuit block 51 is a compound semiconductor chip, the transmitter amplifier 41 of FIG. 5B is, for example, an HEMT. The module may incorporate two semiconductor chips one for transmission and the other for reception. The number of I/O terminals 11 of FIG. 10 are properly set according to the specifications of the chips 51 to 53. The housing 6 of FIG. 10 has a second space 8a just below the antenna pattern 1 and a third space 8b just below the antenna pattern 3. The second and third spaces 8a and 8b are so sized to produce a cavity resonance on a carrier frequency for microwave communication. This improves the efficiency of the antenna patterns 1 and 3.

Although the substrates of the first and second embodiments are made of BCB resin and BT resin, they may be made of polyimide resin and Teflon resin. Conductors employed by the present invention are not limited to those made of copper.

The first, second, and other embodiments of the present invention may be combined in various ways.

Various modifications will become possible for those skilled in the art after receiving the teachings of the present disclosure without departing from the scope thereof.

What is claimed is:

1. A microwave transmitter/receiver module for use in a microwave communication with a carrier frequency, the module comprising;

(a) a housing;

(b) a circuit board disposed on the housing, the circuit board serving as a lid to close the housing, defining an electromagnetically narrowed first space with the housing, the first space having a cutoff frequency higher than the carrier frequency for the microwave communication;

(c) a semiconductor chip attached under the bottom surface of the circuit board so as to be contained in the first space;

(d) a receiver antenna pattern formed on the top surface of the circuit board; and (e) a transmitter antenna pattern formed on the top surface of the circuit board at a different position from the receiver antenna pattern.

2. The module of claim 1, further comprising:

a second space formed Just below the receiver antenna pattern and so sized to produce a cavity resonance on the carrier frequency for microwave communication; and a third space formed Just below the transmitter antenna pattern and so sized to produce a cavity resonance on the carrier frequency for microwave communication.

3. The module of claim 2, wherein the first, second, and third spaces form a single continuous space.

4. The module of claim 3, wherein the single continuous space has an H-shape when viewed from the circuit board.

5. The module of claim 1, wherein the housing is made of a conductor and is insulated from the semiconductor chip.

6. The module of claim 1, wherein the housing is made of an insulator and has a conductor layer to define the first space.

7. The module of claim 1, wherein a conductive ground layer is formed on the top surface of the circuit board.

8. The module of claim 7, wherein the receiver and transmitter antenna patterns are formed on the top surface of the circuit board like islands surrounded by the conductive ground layer.

9. The module of claim 7, wherein the receiver and transmitter antenna patterns are formed on the top surface of the circuit board like islands isolated on opposite sides of the conductive ground layer.

10. The module of claim 1, wherein the package further has:

an input terminal for passing a baseband signal to the semiconductor chip;

an output terminal for passing a baseband signal from the semiconductor chip; and a control signal terminal for passing control signals to control the semiconductor chip.

11. The module of claim 10, wherein the input, output, and control signal terminals pass signals selected from intermediate frequency signals, baseband signals, power source signals, and control signals having lower frequencies than the carrier frequency for microwave communication.

12. The module of claim 1, wherein at least one semiconductor chip is installed in the first space.

13. The module of claim 1, wherein the circuit board consists of:

a first insulation substrate having a top surface on which the receiver and transmitter antenna patterns are formed;

an intermediate conductor layer formed on the bottom surface of the first insulation substrate and having first and second slots; and a second insulation substrate formed on the bottom surface of the intermediate conductor layer.

14. The module of claim 13, further comprising:

first and second feeders formed on the bottom surface of the second insulation substrate and electrically connected to the semiconductor chip.

15. The module of claim 13, wherein the first slot is positioned just below the receiver antenna pattern, and the second slot is positioned just below the transmitter antenna pattern.

16. The module of claim 14, wherein the first feeder in positioned just below the first slot, and the second feeder is positioned just below the second slot.

17. The module of claim 16, wherein the first feeder is electromagnetically coupled with the receiver antenna pattern through the first slot, and the second feeder is electromagnetically coupled with the transmitter antenna pattern through the second slot.

18. The module of claim 14, wherein the first and second feeders are electrically connected to the semiconductor chip through bump electrodes.

19. A microwave transmitter/receiver module for use in a microwave communication with a carrier frequency, the module comprising:

(a) a housing, (b) a lid closing the housing to define an electromagnetically narrowed first space with the housing, the first space having a cutoff frequency higher than the carrier frequency for the microwave communication;

(c) a semiconductor chip contained in the first space;

(d) a receiver antenna pattern attached under the bottom surface of the housing and electromagnetically connected to the semiconductor chip through a first slot formed in the housing; and (e) a transmitter antenna pattern attached under the bottom surface of the housing at a different position from the receiver antenna pattern and electromagnetically connected to the semiconductor chip through a second slot formed in the housing.

20. The module of claim 19, further comprising:

a second space formed just above the receiver antenna pattern and so sized to produce a cavity resonance on the carrier frequency for microwave communication; and a third space formed just above the transmitter antenna pattern and so sized to produce a cavity resonance on the carrier frequency for microwave communication.

* * * * *